United States Patent [19]
Beck

[11] Patent Number: 6,144,692
[45] Date of Patent: Nov. 7, 2000

[54] SYSTEM AND METHOD OF TESTING FOR PASSIVE INTERMODULATION IN ANTENNAS

[75] Inventor: Brian C. Beck, Melbourne Beach, Fla.

[73] Assignee: Harris Corporation, Palm Bay, Fla.

[21] Appl. No.: 09/056,443

[22] Filed: Apr. 7, 1998

[51] Int. Cl.[7] .................................................. H04R 15/00
[52] U.S. Cl. ........................ 375/130; 370/252; 455/67.1; 343/703
[58] Field of Search ............................ 375/130; 370/252; 455/67.1, 67.2, 67.3, 67.4, 67.5; 343/703

[56] References Cited

U.S. PATENT DOCUMENTS

| | | | |
|---|---|---|---|
| 2,987,586 | 6/1961 | Berger ................................. | 179/175.3 |
| 3,605,018 | 9/1971 | Coviello . | |
| 3,694,643 | 9/1972 | Smith . | |
| 3,875,500 | 4/1975 | Fletcher et al. . | |
| 4,028,622 | 6/1977 | Evans et al. . | |
| 4,275,446 | 6/1981 | Blaess . | |
| 4,648,124 | 3/1987 | Mantovani et al. . | |
| 4,754,496 | 6/1988 | Fishkin et al. ........................... | 455/67 |
| 4,918,684 | 4/1990 | Boschet et al. ........................... | 370/17 |
| 5,048,015 | 9/1991 | Zilberfarb . | |
| 5,103,459 | 4/1992 | Gilhousen et al. . | |
| 5,371,760 | 12/1994 | Allen et al. . | |
| 5,461,921 | 10/1995 | Papadakis et al. . | |
| 5,649,304 | 7/1997 | Cabot . | |

OTHER PUBLICATIONS

D. Burkhart, "Intermodulation and Crossmodulation Measured Automatically from 25 to 1000 Megahertz," News from Rohde & Schwartz, vol. 16, No. 74, pp. 7–10, 1976.

*Primary Examiner*—Stephen Chin
*Assistant Examiner*—Mohammad Ghayour
*Attorney, Agent, or Firm*—Allen, Dyer, Doppelt, Milbrath & Gilchrist, P.A.

[57] ABSTRACT

A system and method of testing for passive intermodulation in antennas includes circuitry for generating at least two distinct frequencies. A pulse phase modulator modulates each frequency with a random pseudo-noise sequence to produce respective broad band spread spectrum signals. At least two test antennas receive the respective broad band spread spectrum signals and transmit the signals through free space, where they are reflected into another antenna and receiver, which includes a demodulator for despreading broad band spread spectrum signals. Respective pseudo-noise sequences are generated as in the pulse phase modulator at a predetermined delayed time and mixed with the broad band spread spectrum signal to despread the broad band spread spectrum signals and obtain the desired signal information relating to passive intermodulation produced from the test antenna.

40 Claims, 8 Drawing Sheets

6,144,692

SYSTEM AND METHOD OF TESTING FOR PASSIVE INTERMODULATION IN ANTENNAS

FIELD OF THE INVENTION

This invention relates to testing antennas, and more particularly, for testing passive intermodulation in antennas.

BACKGROUND OF THE INVENTION

In satellite communications, separate transmit and receive signals are generated and received at communication satellites. Typically, a satellite includes an antenna dish for transmitting signals of a first radio frequency to another satellite or a ground receive station. The satellite may also include another reflector or antenna dish of another second similar radio frequency. The satellite also can include a combination of different reflectors and antenna dishes with horns for transmitting and receiving still other frequencies. The satellite transmits and receives along a series of different frequencies that extend in a range F1-F2. These frequencies are far enough apart not to create excessive interference with various transmit and receive communications.

However, in any satellite and similar communication system, the feed lines and antennas are not linear devices. They act essentially like diodes and cause non-linear intermodulation. When the signals are transmitted through the feed lines and antennas, these frequencies form different harmonics and intermodulations producing passive intermodulation, which does not introduce any gain in the system. This passive intermodulation occurs through the modulation components of a complex wave. Thus, waves are produced having frequencies that, among others, are equal to the sums and differences of those components of the original wave.

Testing for intermodulation has been very difficult in the past. Even regular antenna testing typically occurs in an anechoic chamber, where many parameters can be measured, such as the antenna gain. These anechoic chambers are also used for testing for passive intermodulation. However, when testing for passive intermodulation, the chamber has much more stringent design requirements. The anechoic chamber is a building that has few echoes, such as produced by reflections of natural and man-made objects. The chamber surface is covered with electromagnetically absorbing cones, which absorb any passive intermodulation and reflected signals that may be developed by doors, screws or even wires in the floor.

The anechoic chamber is also designed so that the area is free of extraneous signals, such as CB radio signals and other interfering or jamming signals. Naturally, these anechoic chambers are very expensive, even more so for those chambers that are designed for testing for passive intermodulation. Because the slightest object could develop passive intermodulation, it is extremely important that those anechoic chambers designed for testing for passive intermodulation have the highest quality parts, naturally incurring even more expense.

One conventional approach used in testing for passive intermodulation in antennas that could be used in satellite communications has been to place two test antennas generating respective frequencies, F1 and F2, within a high quality anechoic chamber. The two frequencies, F1 and F2, are reflected from a reflector, such as an antenna dish, back into a receiver. A spectrum analyzer then measures the passive intermodulation by means known to those skilled in the art. This measuring could include mixing the various orders of frequencies of the input signal within the spectrum analyzer to obtain the tuned frequency. The anechoic chamber attenuates the reflections, which would interfere with the passive intermodulation measurements.

With satellite communications becoming increasingly more important, while also ground communication stations are increasing their use of antenna dishes, it is important that all antenna devices and their associated components, such as feed systems, be tested for passive intermodulation. Thus, unless alternatives are found for the very stringent design requirements necessary for operating anechoic chambers for testing passive intermodulation in antennas, it is mandatory that large expenditures of personnel time, money and other resources be placed into the design, testing, manufacture and operation of these sophisticated anechoic chambers.

SUMMARY OF THE INVENTION

It is, therefore, an object of the present invention to provide a system and method of testing for passive intermodulation in antennas without using an anechoic chamber having stringent design requirements.

It is still another object of the present invention to provide a system and method of testing for passive intermodulation in antennas that is not prone to deviant measurements due to reflected signals and spurious production of passive intermodulation.

In accordance with the present invention, passive intermodulation is tested in antennas, and is advantageous because it allows testing of antennas without the necessity of an expensive anechoic chamber with stringent design requirements. There is now little concern for spurious reflections or generation of intermodulation. Thus, antennas can be tested in areas such as an open field when an anechoic chamber is not available.

The system of the present invention tests for passive intermodulation in antennas and includes means for generating at least two distinct frequencies. Pulse phase modulation means modulates each frequency to produce respective broad band spread spectrum signals. In a preferred aspect of the present invention, each frequency is modulated with a random pseudo-noise sequence to produce the respective broad band spread spectrum signals. It is also possible to modulate each frequency with a different frequency at predetermined time intervals to produce a spread spectrum signal commonly known as frequency hopping.

The broad band spread spectrum signals are then transmitted to at least two antenna systems to be tested, which receive the signals and transmit the signals through free space to a receive point. Demodulation means receives the broad band spread spectrum signals and demodulates or "collapses" (despread) the signals to obtain the desired signal information relating to the passive intermodulation produced from the two antenna systems. The demodulation means includes a receiver for receiving the spread spectrum signals, means for generating the same pseudo-noise sequence at a predetermined delayed time, and a mixer for mixing the broad band spread spectrum signals with generated pseudo-noise sequences for despreading or "collapsing" the broad band spread spectrum signals to obtain the desired signal information relating to the passive intermodulation produced from the antennas.

In one aspect of the present invention, any signals generated by any reflections or passive intermodulation that is not synchronized with the original spread spectrum signals is decorrelated. Pulse phase modulation means can also comprise a shift keyed modulator. Pulse phase modulation means also can generate a random pseudo-noise sequence that is orthogonal. Pulse phase modulation means also can comprise a mixer, which can be a doubly balanced mixer.

In order to ensure that the spread or "collapsed" energy of the spread spectrum signal is not greater than the bandwidth of the respective test antennas, the pulse phase modulation means generates the random pseudo-noise sequence such that the spread energy is substantially within the bandwidth of the respective test antennas. The means for generating the same pseudo-noise sequence at a predetermined delayed time at the receiver also can comprise an oscillator that is synchronized with the transmitted spread spectrum signals, such that the generated PN sequence at the receive end will "collapse" or despread the spread signal to obtain the original carrier and associated harmonics and intermodulation.

In a method aspect of the present invention, at least two frequencies are generated. The method further comprises pulse phase modulating each frequency by mixing each generated frequency with a random pseudo-noise sequence to produce respective broad band spread spectrum signals. Each spread spectrum signal is transmitted through respective test antennas. The method further comprises the step of demodulating the received spread spectrum signals by generating the same pseudo-noise sequence at a predetermined delayed time and mixing the broad band spread spectrum signal with the generated pseudo-noise sequence for decorrelating the broad band spread spectrum signal to obtain the desired signal information relating to the passive intermodulation produced from the test antennas.

In still another method aspect of the present invention, transmitted spread spectrum signals can be reflected from a reflector into a receive antenna. The method further comprises the step of decorrelating any signals generated by any reflections or passive intermodulation that is not synchronized with the original spread spectrum signals. The method further comprises the step of pulse phase modulating each frequency by modulating each frequency with a shift keyed modulator. The random pseudo-noise sequence can also be generated orthogonal. The step of mixing further comprises the steps of mixing within a doubly balanced mixer. The random pseudo-noise sequence is preferably generated such that the spread energy is substantially within the bandwidth of the respective test antenna.

DETAILED DESCRIPTION OF THE DRAWINGS

Other objects, features and advantages of the present invention will become apparent from the detailed description of the invention which follows, when considered in light of the accompanying drawings in which.

FIB. 3d is a graph depicting band edge frequencies for transmit and receive functions.

Figure 3A:
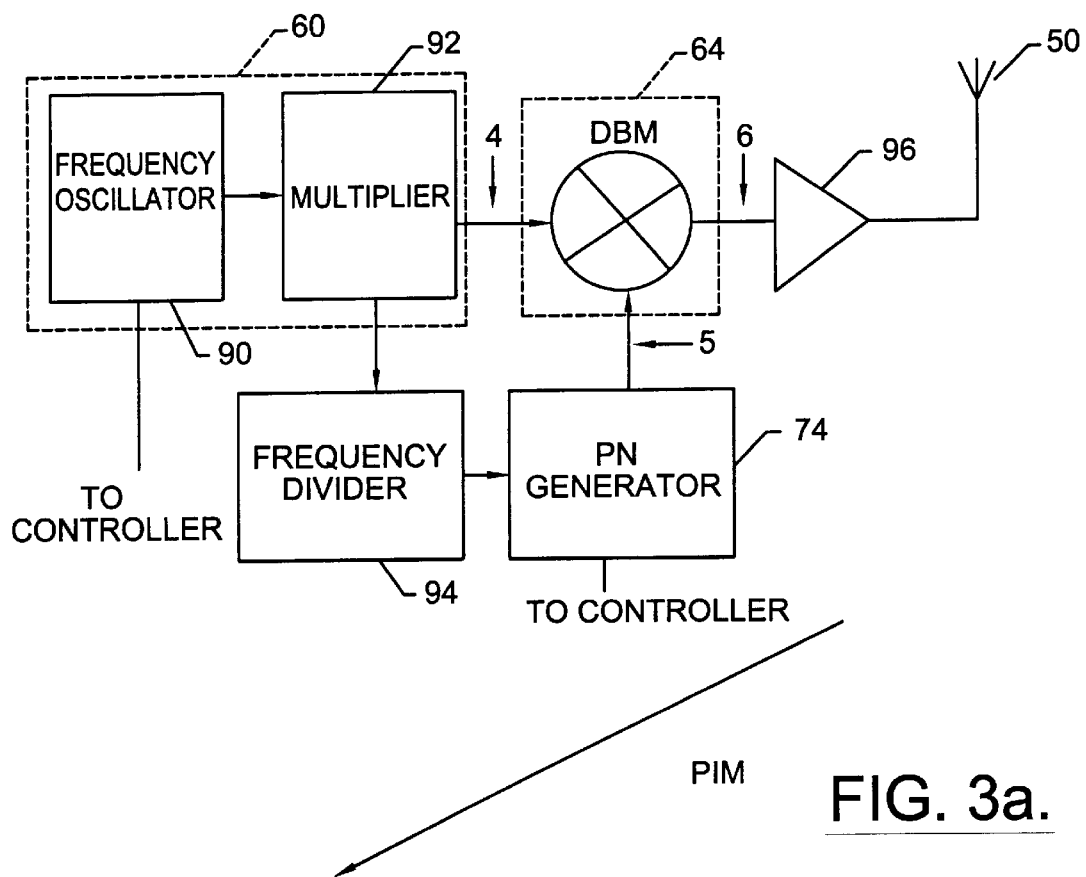
FIG. 3a is a block diagram showing basic components of the system of FIG. 2.
Figure 3A:
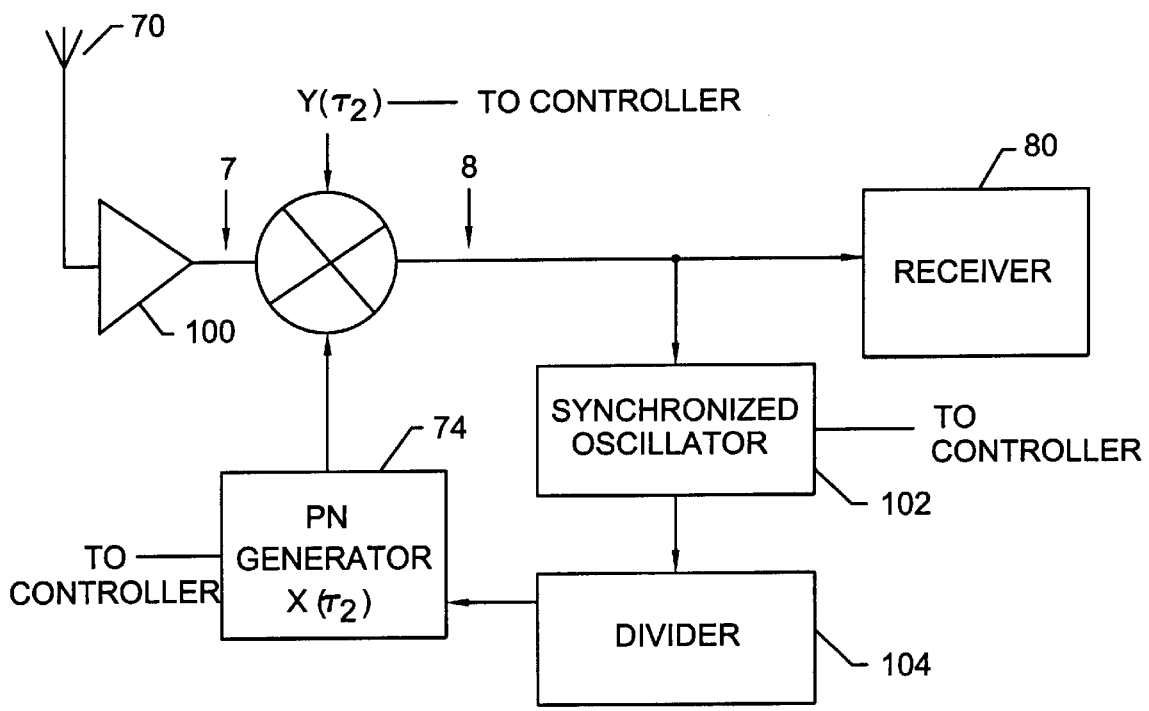
Figure 3B:
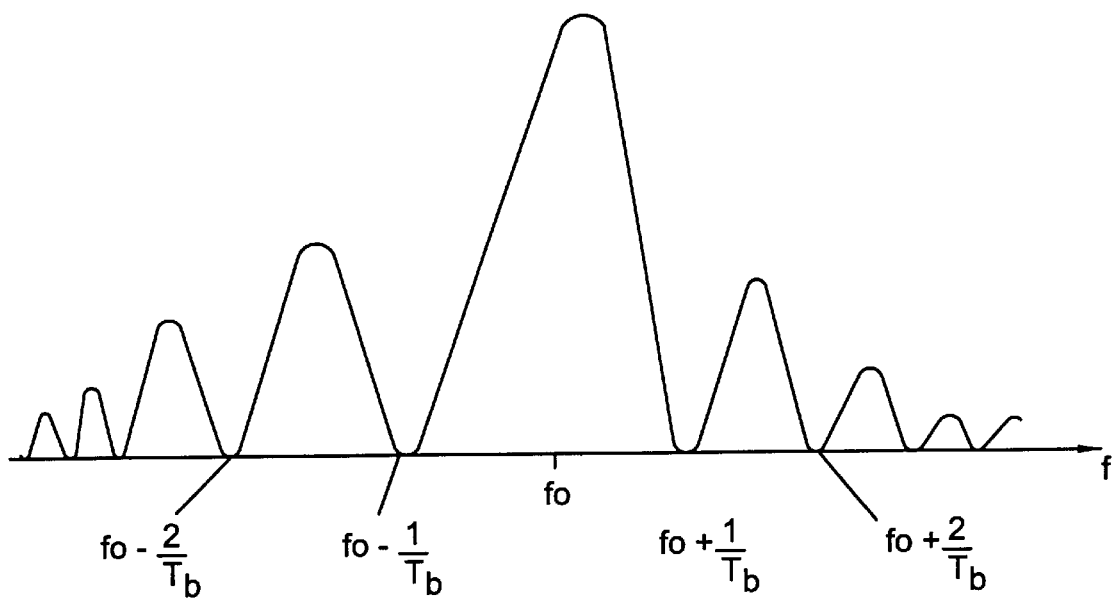
FIGS. 3b and 3c are graphs depicting data modulated and spread spectrum signals, respectively.
Figure 3C:
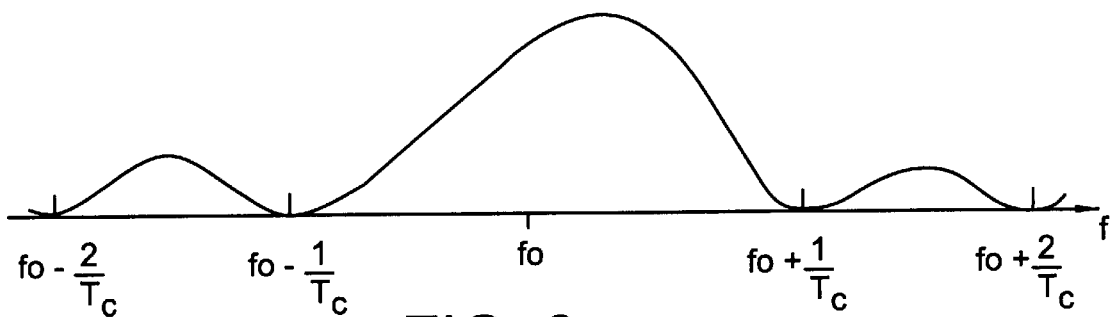
Figure 3D:
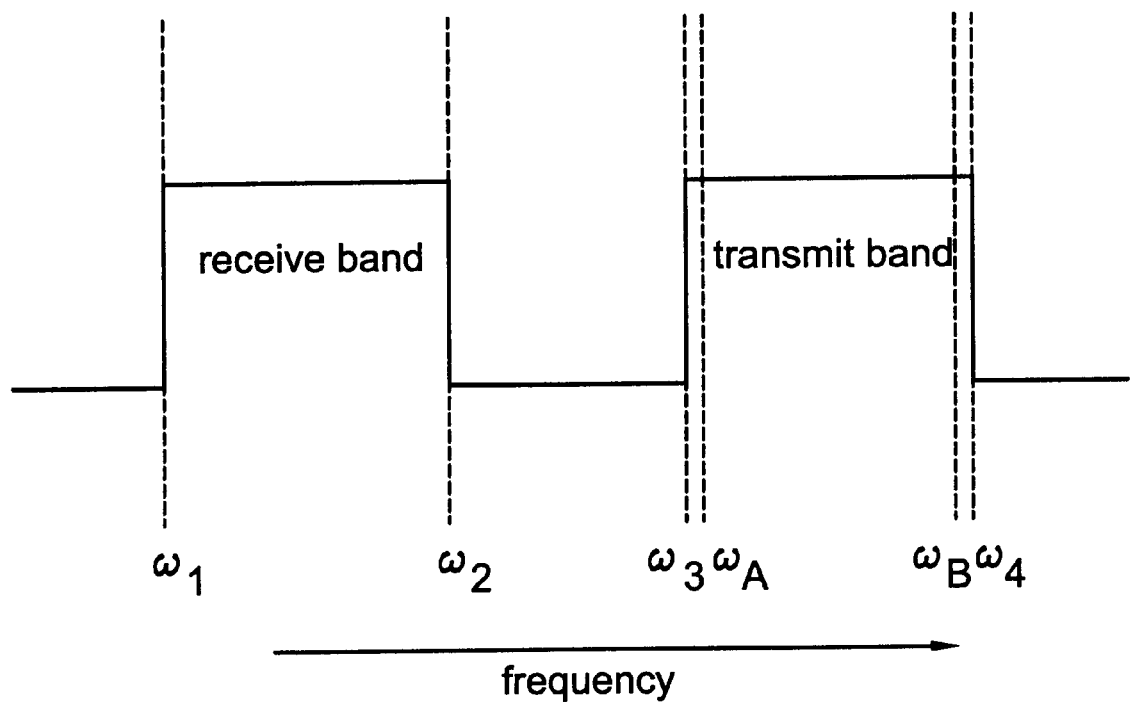
Figure 4:
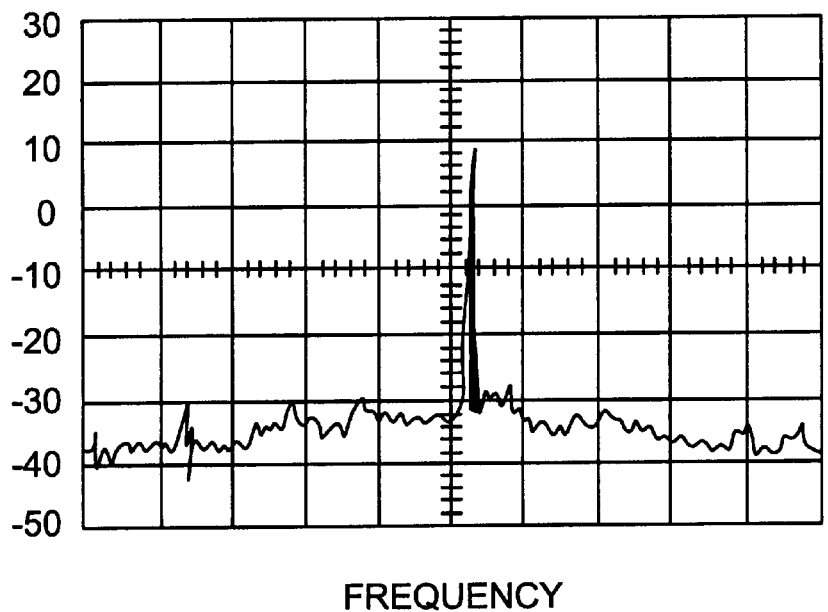

FIG. 4 is a spectrogram showing a generated frequency as at line 4 in FIG. 3, before modulation with a pseudo-noise sequence.

Figure 5:
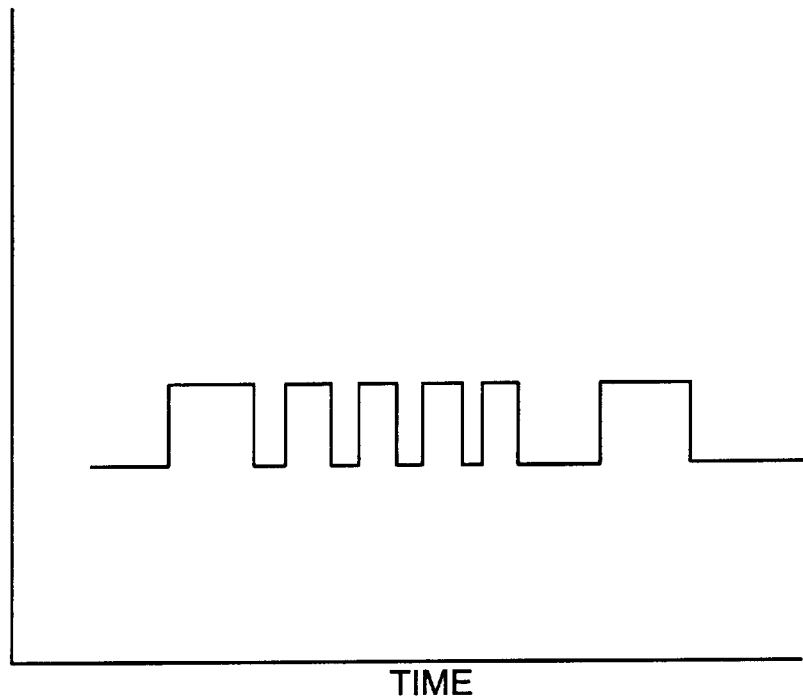

FIG. 5 is a graph showing the generated pseudo-noise sequence as a function of time and amplitude, such as taken at line 5 in FIG. 3.

Figure 6:
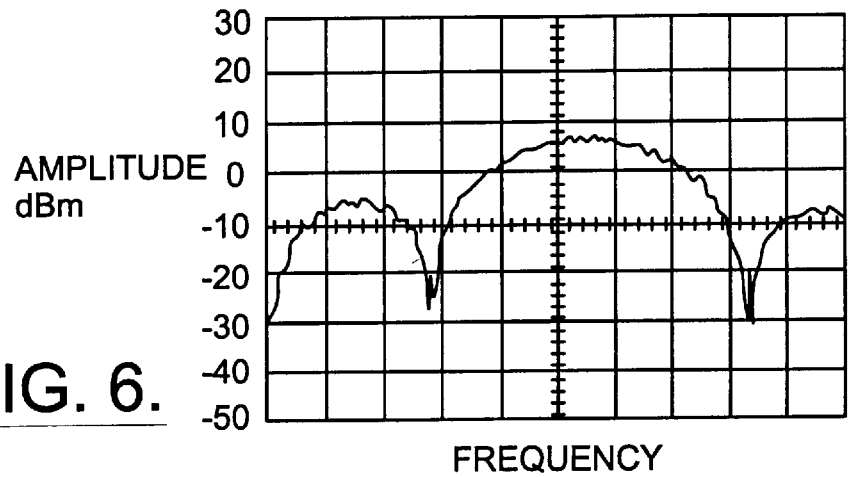

FIG. 6 is a spectrogram showing the envelope of an unfiltered biphase, modulated spread spectrum signal, such as taken at line 6 in FIG. 3.

Figure 7:
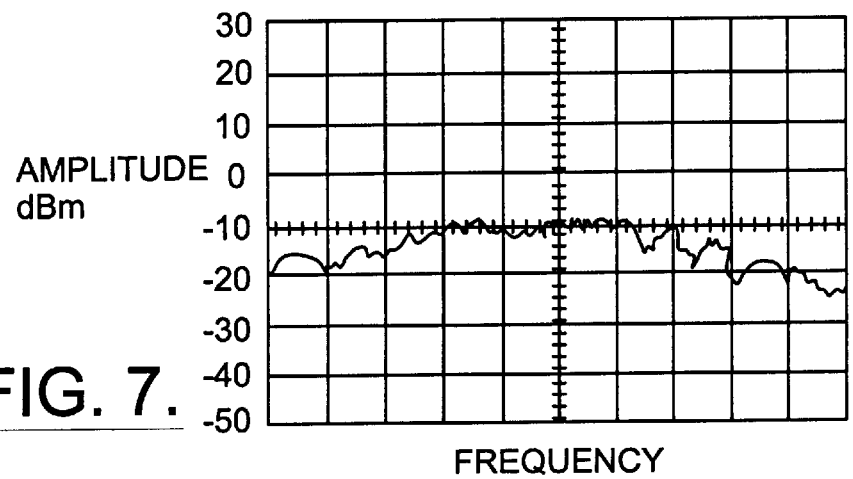

FIG. 7 is a spectrogram showing the received spread spectrum signal, such as taken at line 7 on FIG. 3, and showing the small hump in the noise floor.

Figure 8:
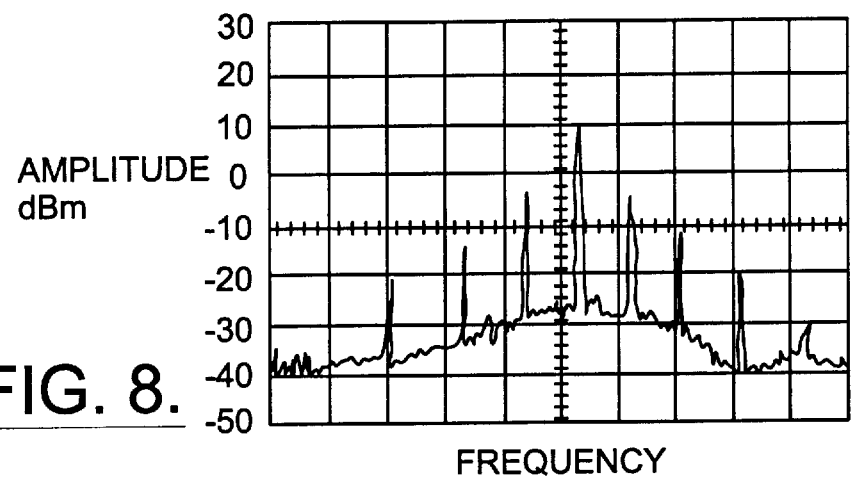

FIG. 8 is a spectrogram showing the despread signal at the output of a receiver mixer, such as taken at point 8 of FIG. 3.

Figure 9:
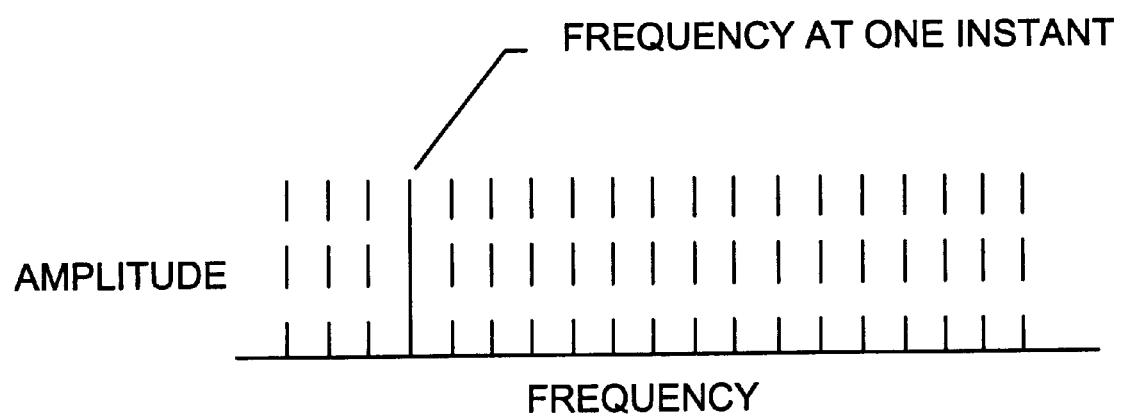

FIG. 9 is a spectrogram of power versus frequency of frequency-hopping spread spectrum signals.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous over prior art systems and methods for testing for passive intermodulation in antennas and similar devices because the necessity of having an anechoic chamber with stringent design requirements is no longer necessary. In the present invention, two antennas can be tested for passive intermodulation. Two respective frequencies, F1 and F2, are generated, and each generated frequency is modulated to produce respective broad band spread spectrum signals, which are transmitted through the respective antennas. The signals are then demodulated in a demodulator, receiver, and spectrograph, which includes circuitry for despreading or "collapsing" the broad band spread spectrum signals to obtain the desired signal information relating to the passive intermodulation produced from the antennas. Any signals that are generated by reflections, or any passive intermodulation that is not synchronized with the original spread spectrum signals is decorrelated. When a pulse phase modulation system is used, and the resultant broad band spread spectrum signals are collapsed, any spurious signals, such as a CB signal, which is received and demodulated using the same pseudo-noise sequence, but at a delayed time, would be decorrelated out of the test signals. When the desired information is despread or "collapsed," any other spurious signals would be subject to the pseudo-noise sequence and have widened energy.

Figure 1:
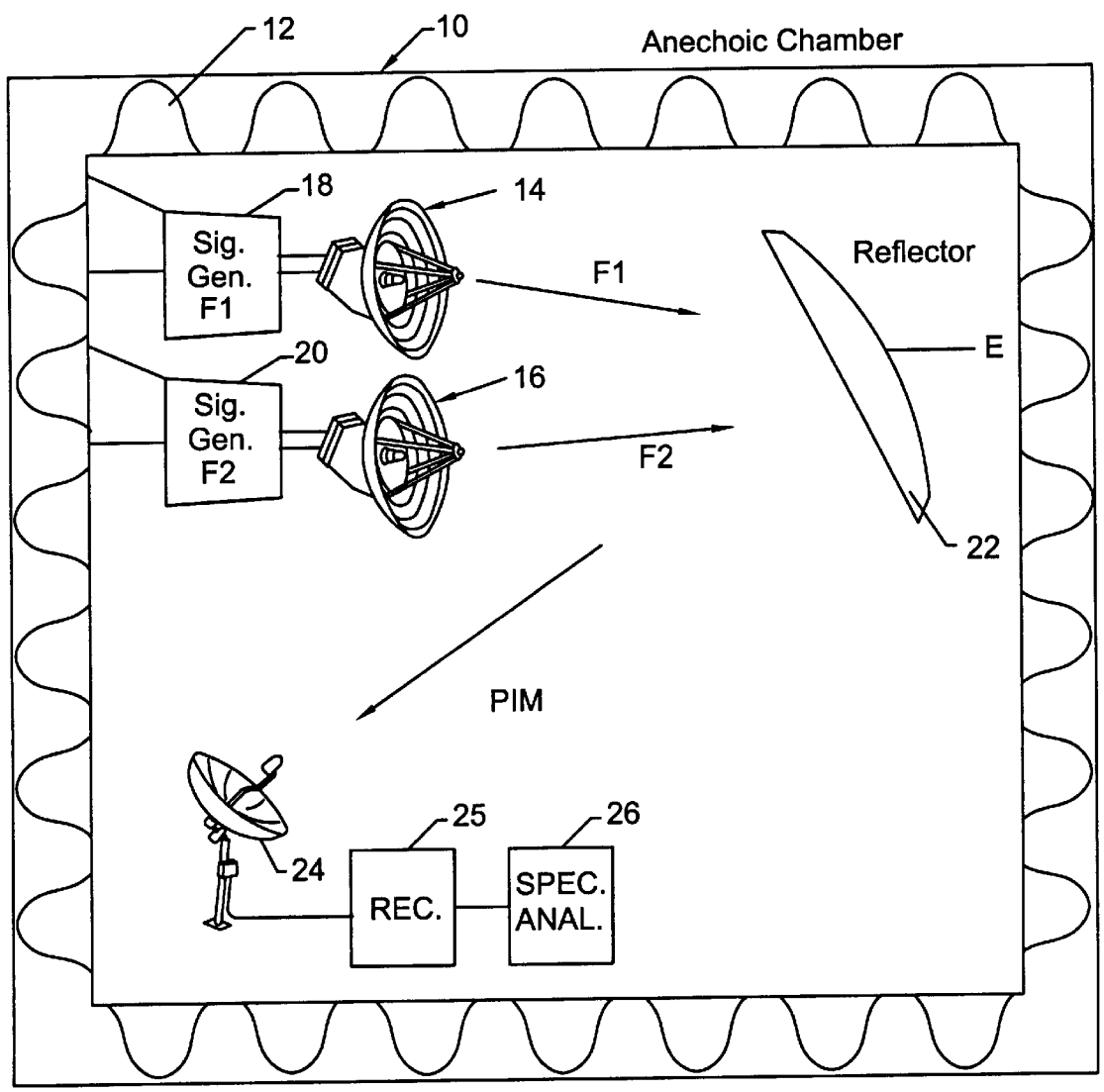
FIG. 1 is a schematic view of a prior art anechoic chamber having first and second antennas that are tested for passive intermodulation using a spectrum analyzer.

Referring now to FIG. 1, a prior art anechoic chamber 10 used for testing for passive intermodulation is illustrated. FIG. 1 illustrates a system and method for testing for passive intermodulation in antennas using this prior art anechoic chamber 10. Typically, the anechoic chamber is a large expensive chamber. This anechoic chamber 10 used for testing passive intermodulation typically has much more stringent design requirements than normal anechoic chambers, such as used for testing antenna gain, because passive intermodulation can be generated by something as little as a steel screw when positioned in an anechoic chamber. Therefore, the chamber 10 typically includes an inside surface that generates few or no echoes because the surface is covered with electromagnetically absorbing cones, illustrated schematically at 12. These cones 12 absorb any passive intermodulation that may be developed by doors, screws or even wires in the floor, and also keep out extraneous signals, such as CB radio signals and other interfering or jamming signals.

As shown in FIG. 1 prior art, two test antennas 14,16 are mounted in the anechoic chamber 10 by a mounting system that produces few echoes and passive intermodulation. Each test antenna includes a respective signal generator 18,20 that generates respective frequencies, F1 and F2. The signal generators 18,20 and test antennas 14,16 include the standard circuitry associated with such testing systems. The generated frequencies, F1 and F2, then are transmitted through the free space of the anechoic chamber where they encounter a reflector 22, such as commonly used in satellite communications. This reflector 22 can have an antenna dish design. The reflector 22 reflects frequencies F1 and F2 to the receiving antenna 24. The transmission of these close frequencies, F1 and F2, can typically correspond to transmit and receive frequencies commonly found in satellite communications.

Unfortunately, the feed systems for these satellite antennas 16, such as the cables and wave guides, as well as the actual antennas used in these satellites, are not perfectly linear devices. They act as diodes and, thus, cause non-linear intermodulation. With the sum and difference frequencies, it is possible to end up with the various frequencies such as F1-F2; 2(F1-F2); 2(F2-F1); 3(F1-2F2); (F1-2F2) and other harmonics and different frequencies. These frequencies and harmonics cause problems relating to passive intermodulation. In satellite communications, the antenna intermodulates the signals together and generates back the interference into the receiver. This can cause jamming, especially in the space environment. Thus, it would not be possible to receive the desired signals and path loss could be as much as 200 decibels.

As shown in the FIG. 1 prior art, the receive antenna 24 receives the signals that are reflected. A receiver 25 and spectrum analyzer 26 then processes the signals to look for the presence of F1-F2 and the different series of harmonics and intermodulation frequencies to determine passive intermodulation. The present invention is advantageous over the prior art system and method such as shown in FIG. 1 because an anechoic chamber having stringent design requirements is no longer necessary.

FIGS. 2–8 illustrate a system and method of testing for passive intermodulation, such as in antennas, where each generated frequency to be transmitted from a test antenna is modulated with a random pseudo-noise sequence to produce respective broad band spread spectrum signals. A demodulator receives the broad band spread spectrum signals, and a respective pseudo-noise generator generates the same pseudo-noise sequence as used in forming the original broad band spread spectrum signal at the transmit side. A demodulator receives both the pseudo-noise sequence and received spread spectrum signals, and despreads or "collapses" the signals to obtain the desired signal information relating to the passive intermodulation produced from the test antennas. Although FIGS. 2–8 describe a system and method of testing for passive intermodulation using a pulse phase modulator, it should be understood that frequency hopping and other systems and methods for forming a broad band spread spectrum signal can also be used as known to those skilled in the art.

The present invention as described below will use direct sequence modulation, which phase-modulates a sine wave by a continuous string of pseudonoise code chips (symbols of much smaller duration than a bit). As is well known to those skilled in the art, this string is typically based on a random sequence of pseudonoise spectrum spreading code that repeats only after a predetermined pseudonoise code period. This pseudonoise code-modulated signal can be characterized by the equation below:

$$s(t) = \sqrt{2P}\, PN(t)d(t) \cos(\overline{\omega}_0 t + \theta)$$

where P is the transmitted signal power; PN(t) represents the spectrum spreading code; d(t) is the data sequence, which is inherently random or at least unknown to the receiver and contains the information to be communicated bit by bit; $\overline{\omega}_0$ is the carrier radian frequency; and $\theta$ is the carrier phase. Both the data and the pseudonoise code are multiplied by the carrier, $\cos(\overline{\omega}_0 t + \theta)$.

This modulation method is known as phase shift keying. If $T_b$ is the duration of a bit expressed in seconds, then typically the duration of a pseudonoise code $T_c$ would occur during one bit (of the order of hundreds). Both the data and the pseudonoise code phase-modulate the carrier by 0° or 180° according to whether PN(t)d(t) is +1 or −1.

In a basic biphase pseudonoise-encoded spread spectrum system transmitter and receiver, digital data represented by the information to be transmitted and is biphase-modulated onto the carrier. The pseudonoise code generator biphase-modulates the carrier.

The spectra of both the data-modulated carrier and the spread spectrum signal are illustrated in FIGS. 3b and 3c. The data modulation has a bandwidth $BW_d = 2/T_b$. The spread spectrum signal has bandwidth $BW_{PN} = 2/T_c$. Since $T_b$ is much larger than $T_c$, $BW_{PN}$ is much larger than $Bw_d$. As a result, the pseudonoise-encoded signal has much greater bandwidth than the dat-modulated signal. As shown in comparison of FIGS. 3b and 3c, the spread spectrum signal of FIG. 3c is spread out.

The receiver aligns the pseudonoise code generator timing with the received pseudonoise code timing. This is accomplished first by acquisition, where time shifts of the locally generated code are correlated with the received signal plus receiver noise. When code alignment is close, the correlated output becomes large. Second, a tracking circuit is engaged. The received signal is then despread.

As is well known to those skilled in the art, the tracking circuit (a code tracking loop) maintains the local receiver code aligned with the received code. The received code can be multiplied by the locally generated pseudonoise code, which then removes the code on the received signal because $[PN(t)]^2 = 1$.

At this time, a biphase-modulated signal must be demodulated using a carrier tracking loop, such as a Costas loop or a squaring loop, tracking the carrier $\cos(\overline{\omega}_0 t + \theta)$. This allows phase-coherent demodulation of the data d(t), i.e., multiplication by a signal exactly in phase with the received carrier. Demodulation of the data can be described mathematically by multiplying the equation given above by $\sqrt{2} \cos(\overline{\omega}_0 t + \theta)$, leaving the data d(t).

A bit synchronizer tracks the data bit sequence. A data demodulator integrates over a bit period and electronically dumps (resets to zero), determining if a positive unit pulse (bit) or a negative unit pulse has been transmitted. This bit sequence determines the message being sent.

The reconstructed pseudonoise code is never perfectly aligned with the received code, and the locally generated carrier likewise is not exactly in phase with the received carrier. Degradations therefore occur to the system as compared to an idealized system.

If an unmodulated tone at the carrier frequency is present at the receiver along with the spread signal, then in a pseudonoise code despreading process, the undesired tone is spread or multiplied by the local pseudonoise code. This spreads its spectrum to a bandwidth $2/T_c$. However, the received signal is collapsed to a bandwidth of $2/T_b$ ($T_b>>T_c$) so that the data detector only "sees" a small fraction, $T_c/T_b$, of the original tone energy. The processing gain, the ratio $T_b/T_c$ (>>1), is used to determine the efficiency of a spread spectrum system in rejecting unwanted interference.

Low probability of intercept is achieved because the spread signal is wideband and has low spectral height. It cannot be easily detected in a noise background. Message privacy is assured if the actual pseudonoise code sequence used by the transmitter and receiver is unknown to unwanted listeners. Multipath tolerance is achieved by searching first with minimum delay and then expanding the search to larger delays. The desired signal will have less delay than the multipath signal and will be acquired first.

Additional processing can be used to greatly minimize the multipath problems. If a set of essentially orthogonal codes such as Gold codes (modified pseudonoise codes) are used, many users can occupy the same bandwidth and only transmitter-receiver pairs with the same code can communicate. Since the pseudonoise chips are very short in time, ranging can be made accurate to a small fraction (5%) of a time. Additional schemes are known to those skilled in the art, and can be found generally in "Spread Spectrum Communication," *Encyclopedia of Science and Technology*, McGraw-Hill, 1992.

A typical communication terminal comprises both transmit and receive functions operating in separate frequency bands. Especially when these bands are relatively closely spaced, passive intermodulation (PM) products resulting from transmit energy may fall into the receive band, causing interference. FIG. 3d defines band-edge frequencies for transmit and receive bands. Although this figure shows the transmit band higher in frequency than the receive band, the opposite may be true; in this case, the description herein still applies.

The transmit frequency band of interest is bounded by lower frequency $\omega_3$ and upper frequency $\omega_4$. Test frequencies $\omega_A$ and $\omega_B$ are selected such that $\omega_A \geq \omega_3$, while $\omega_B \cong \omega_4$, but in any case where $\omega_B > \omega_A$. Continuous wave (CW) carrier signals, generated at frequencies $\omega_A$ and $\omega_B$ are each spread-spectrum modulated with pseudo-random sequences $X_A(t)$ and $X_B(t)$ respectively. The resultant transmitted signals are $S_A(t)=X_A(t)\cos \omega_A t$ and $S_B(t)=X_B(t)\cos \omega_B t$ (of arbitrary amplitude for purposes of explanation). These signals travel through space to impinge on a unit-under-test (UUT) incurring a delay, $\tau 0$, corresponding to the direct path length. For simplicity, assume that the return path length, the distance from UUT to the receive test antenna, also is $\tau 0$. The signals incident at the test antenna are then of the following type:

1)

$$K_{BO}X_A(t+2\tau 0)\cos \omega_A(t+2\tau 0) + K_{BO}X_B(t+2\tau 0)\cos \omega_B(t+2\tau 0),$$

which is simply reflected direct energy from the test signals where $k_{AO}$ and $K_{BO}$ represent cumulative path and reflection losses. The test receiver input filter rejects these signals as out of band, because $\omega_A$ and $\omega_B$ are not in the receiver's bandwidth.

2) Similar components reflecting from other areas of the test environment, which take the form:

$$\sum_n \{k_{An}X_A(t+2\tau_n)\cos\omega_A(t+2\tau_n) + k_{Bn}X_B(t+2\tau_n)\cos\omega_B(t+2\tau_n)\}.$$

where n corresponds to each path delay and each path loss for all n reflections. Again, these are all rejected by the test receiver's input filter, because $\omega_A$ and $\omega_B$ are not in the receiver's bandwidth.

3) Passive intermodulation ({IM) products resulting from non-linear processes in the UUT interacting with the impinging signals all frequencies $\omega_A$ and $\omega_B$. These PIM products result from the series:

$$\sum_n \{k_{BOn}S_A(t+\tau_0) + k_{BOn}S_B(t+\tau_0)\}^n.$$

This series yields products (ignoring gain coefficients):

$$s_A^n s_B^0 + s_A^{n-1} s_B^1 + s_A^{n-2} s_B^2 + \ldots + s_A^2 s_B^{n-2} + s_A^1 s_B^{n-1} + s_A^0 s_B^n.$$

These products contain frequency terms:

$$(n\omega_B +/- 0\omega_A) + \{(n-1)\omega_B +/- 1\omega_A\} + \{(n-2)\omega_B +/- 2\omega_A\} + \ldots + (2\omega_B +/- (n-2)\omega_A) + (1\omega_s +/- (n-1)\omega_A) + (0\omega_B +/- n\omega_A).$$

Of interest for measurement are frequency terms within or near the receive band, between $\omega_1$ and $\omega_2$, since the objective system these terms would be regarded as interference or noise. Which terms fall in or near the receive band depends upon selection of receive and transmit bands. Practically, only difference terms of order 3 through 11 are of special concern, because typical non-linear processes generate most energy in these lower orders and because only odd-order products may fall in or near the receive band. The frequencies of these orders of practical interest are:

3rd order: $2\omega_A - 1\omega_B$
5th order: $3\omega_A - 2\omega_B$
7th order: $4\omega_A - 3\omega_B$
9th order: $5\omega_A - 4\omega_B$
11th order: $6\omega_A - 5\omega_B$ Thus, as known to those skilled in the art, PIM products are received in space at the receive antenna, resulting from non-linear reflections from the UUT. Further details and designs will be known to those skilled in the art.

Figure 2:
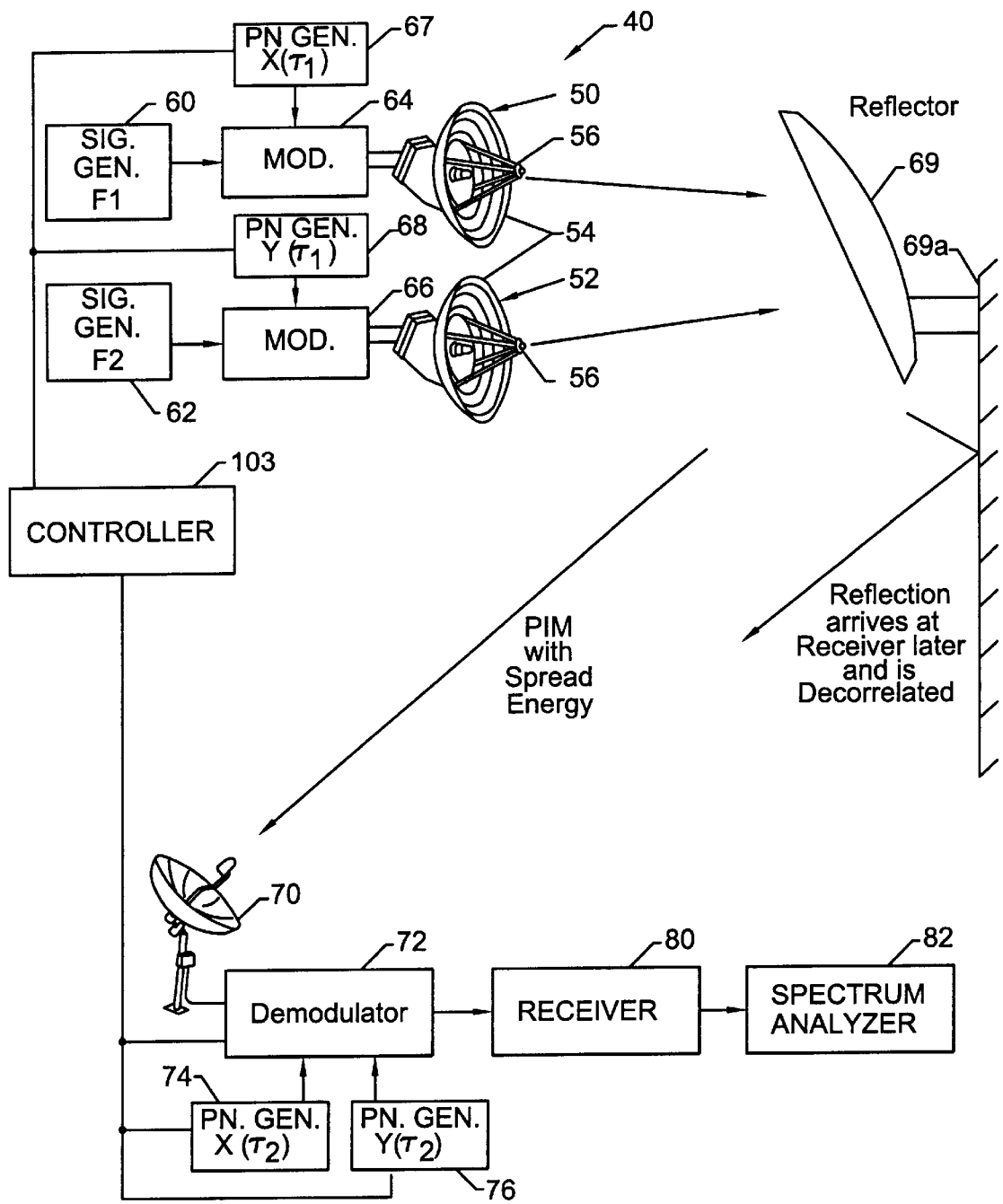
FIG. 2 is a schematic environmental view of the system of the present invention showing two test antennas that transmit a spread spectrum signal, which is demodulated and analyzed by a spectrum analyzer to determine the passive intermodulation.

Referring now to FIG. 2, there is illustrated a system 40 of testing for passive intermodulation in two test antennas, 50 and 52. Both test antennas 50,52 are illustrated as dish antennas, each having a parabolic reflector 54 and a horn 56. However, the present invention can be used for testing any type of antenna, as well as many other types of wave guides and other communication devices that could be subject to passive intermodulation.

As illustrated, the system 40 broadly includes first and second signal generators 60,62 which produce respective test signals at frequencies, F1 and F2. The signals are then transmitted to respective first and second modulators 64,66 where a first pseudonoise component $X(\tau_1)$ is mixed within first modulator 64 for modifying F1 to produce a broad band spread spectrum signal. A second pseudo-noise sequence $Y(\tau_1)$ is mixed within the second modulator 66 to produce a second broad band spread spectrum signal. The pseudonoise sequences are produced by respective PN generators, 67,68. The modulators 64,66 can be biphase or quadriphase shift key modulators, and $X(\tau_1)$ and $Y(\tau_1)$ are preferably orthogonal pseudo-noise random sequences. The generated broad band spread spectrum signals then are transmitted from the respective test antenna 50,52 into free space where they engage a reflector 69 and are reflected into the receive antenna 70. The reflector 69 can be designed as a parabolic dish antenna and mounted to a structure, such as a wall 69a. The receive antenna 70 can also be designed as a parabolic antenna dish, as illustrated.

The broad band spread spectrum signals are despread, i.e., "collapsed" by demodulating in demodulator 72 with pseudo-noise random sequences $X(\tau_2)$ and $Y(\tau_2)$. These sequences correspond to the same sequences used in modulating the transmission, except the sequences are delayed to account for the radio frequency path loss. The random sequences are produced by respective first and second PN generators 74,76. The demodulated, i.e., despread, broad band spread spectrum signals are then received into a receiver 80 and a spectrum analyzer 82, which obtains the desired signal information relating to the passive intermodulation produced from the test antennas 50,52. It is evident that any reflections produced, such as from the wall 69a, arrive at the receiver 80 later and are decorrelated. Other signals that may not have been part of the broad band spread spectrum transmission, once subject to the pseudo-noise random sequence in the demodulator 72, will become spread and have a broad band energy level and thus be decorrelated. The demodulated passive intermodulation will have a series of narrow spikes, and no longer the broad band envelope, corresponding to the original spread spectrum energy level.

Referring now to FIG. 3, there is illustrated a block circuit diagram showing greater details of the various components that could be used in the system 40 of the present invention. Only one signal generator 60 and modulator 64 of FIG. 2 at the transmit side is illustrated in FIG. 3 for purposes of simplicity.

As shown in FIG. 3, the signal generator 60 includes a frequency oscillator circuit 90 that generates the desired frequency corresponding to F1. The generated frequency then is multiplied in a multiplier circuit 42. A part of the signal then is transmitted to a frequency divider circuit 94 where the frequency is divided by as little as half to as many as 1/40 or more of the original signal as known to those skilled in the art. The divided signal then is forwarded to the PN generator 67, which generates a random pseudo-noise sequence, such as shown in the representation of a spectrogram of FIG. 5, where amplitude is shown on the vertical axis and time on the horizontal axis. This sequence is a random pulse train having a constant amplitude, but which will work to "despread" the frequency component of the generated signal. The generated frequency exits the multiplier circuit 92 having a frequency component, as illustrated in the spectrogram of FIG. 4, and taken at line 4, showing a frequency spike corresponding to the original carrier and modulation components that accompany it. As shown, the peak carrier is about 30 or 40 decibels above the noise floor. This signal will act as one test signal to determine passive intermodulation in the test antennas 50,52.

This signal is forwarded to the modulator 64, which in the present invention can comprise a doubly balanced mixer (DBM) where the frequency is mixed with the generated pseudo-noise sequence to form a broad band spread spectrum signal as shown in the spectrogram of FIG. 6. The modulator 64 is a mixer as is well known to those skilled in the art, and the PN generator and mixer works as a biphase or quadriphase modulator, depending on the chosen design by one skilled in the art. Naturally, the second test antenna 52 would receive broad band spread spectrum signals that have been generated by the same process as described above, but with the second signal generator 62, PN generator 68 and modulator 66.

As illustrated by the spectrogram of FIG. 6, the envelope of an unfiltered biphase-modulated, broad band spread spectrum signal is viewed on a spectrum analyzer. As shown, the envelope includes three lobes and has a broad band spread energy. This broad band spread spectrum signal then is transmitted through an amplifier 96 that may include appropriate filters as known to those skilled in the art, and then transmitted through the test antenna 50 to the receive end of the system and to a receive antenna 24. The signal is amplified and filtered in an amplifier and filtering circuit 100.

The spectrogram of FIG. 7, taken at line 7, shows a filtered broad spread spectrum signal as received, and shows only a 5–10 decibel hump in the noise floor. An oscillator 102 is synchronized with the transmit end PN generator and the transmitted spread spectrum signals, such as through an appropriate controller 103 (FIGS. 2 and 3), which also connects to PN generators. The oscillator 102 generates signals that are divided in divider 104 and then forwarded to a PN generator 74, which generates a pseudo-noise sequence $X(\tau_2)$ that is the same sequence used in the transmit side, but delayed to account for radio frequency path loss. This sequence is forwarded to the demodulator 72, which can be a doubly balanced mixer as known to those skilled in the art.

Additionally, another synchronized oscillator generates with the PN generator 76 (FIG. 2), a pseudonoise sequence $Y(\tau_2)$ that is mixed in the mixer or demodulator with the incoming broad band spread spectrum signals in order to despread or "collapse" the energy in the spread spectrum signals. The signals then are forwarded to the receiver 80 and its appropriate circuitry processes the despread signals together with the spectrum analyzer 82. A spectrogram is produced as shown in FIG. 8, showing the passive intermodulation and the different frequency components as spikes.

It should be understood that frequency hopping can also be used for forming the broad band spread spectrum signal, as shown in FIG. 9, where power versus frequency for a frequency-hopping spread spectrum signal is illustrated. The emissions move or "jump" around to discreet separate frequencies in a pseudo-random fashion, thus, creating a broad band spread spectrum signal. Other possible types of spread spectrum signal generation includes the use of direct-sequence and frequency-time dodging. The direct-sequence wave forms are typically pseudo-random digital streams generated by digital techniques and without using any type of spectral filtering. It is only when heavy filtering is used that the signal becomes noise like, thus forming a PN wave form. In both systems, correlation detection would be used because the wave form would be dimensionally too large to implement a practical matched filter, and the sequence generator is relatively simple and capable of changing codes for the invention.

In a frequency hopping system, the spectrum is divided into subchannels that are spaced orthogonally at 1/T separations. One or more separations can be selected by pseudo-random techniques for each data bit. In a time-dodging scheme, the signal burst time would be controlled by a pulsed repetition method, while in a frequency-timed dodging system, both types of selections would be used. A frequency-hop signal can be generated using SAW chirp devices. Synchronization is always a problem in any type of spread spectrum system and the receiver typically must store a reference timing to within plus or minus 1/(2W) of the width of the receive signal and hold it at that value. There are also various methods to reduce the synchronization acquisition time. These methods include using timing references to start PN generators, using shorter sequences for acquisition only, "clear" synchronization triggers, and paralleling detectors. Such techniques are known to those skilled in the art.

It is evident that any reflections from the wall 69a or a tree arrives late at the receiver and is decorrelated. Other signals such as extraneous radio or microwave signals that are not initially subjected to the PN sequence at the modulator and spread would be spread at the demodulator, while the energy from the passive intermodulation to be tested is being collapsed.

The system and method of the present invention is advantageous over the prior art system and method for testing for passive intermodulation because the strict design requirements of an anechoic chamber are no longer required. Even if many different reflective broad band spread spectrum signals were mixed with spurious signals, such as microwaves and radio frequencies generated from outside the testing area, the signals would either be despread out of time with the original radio frequency, or would be spread by the pseudo-noise sequence generated at the receive end of the system. Therefore, the system and method of the present invention saves money by reducing design costs and makes operation much more efficient.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A system of testing for passive intermodulation in antennas comprising:
   means for generating at least two distinct frequencies;
   pulse phase modulation means for modulating each frequency with a random pseudo-noise sequence to produce respective broad band spread spectrum signals;
   at least two test antennas for receiving respective broad band spread spectrum signals and transmitting the signals through free space;
   demodulation means for receiving the reflected broad band spread spectrum signals, said demodulation means comprising:
      a receiver for receiving the spread spectrum signals,
      means for generating the respective pseudo-noise sequences as in the said pulse phase modulation means at a predetermined delayed time, and
      means for mixing the broad band spread spectrum signal with the generated pseudo-noise sequence for despreading the broad band spread spectrum signals to obtain the desired signal information relating to the passive intermodulation produced from the test antennas.

2. A method according to claim 1, and further comprising means for decorrelating any signals generated by any reflections or passive intermodulation that is not synchronized with the original spread spectrum signals.

3. A system according to claim 1, wherein said pulse phase modulating each frequency comprises the steps of modulating each frequency by a shift keyed modulator.

4. A system according to claim 1, and wherein said pulse phase modulation means generates a random pseudo-noise sequence that is orthogonal.

5. A system according to claim 1, wherein said pulse phase modulation means comprises a mixer.

6. A system according to claim 5, wherein said mixer comprises a doubly balanced mixer.

7. A system according to claim 1, wherein said pulse phase modulation means generates the random pseudo-noise sequence such that the spread energy is substantially within the bandwidth of respective test antennas.

8. A system according to claim 1, wherein said means for generating the same pseudo-noise sequence at a predetermined delayed time comprises an oscillator synchronized with the transmitted spread spectrum signals and including a pseudo-noise generator.

9. A system of testing for passive intermodulation in antennas comprising:
   means for generating at least two distinct frequencies;
   pulse phase modulation means for modulating each frequency with a random pseudo-noise sequence to produce respective broad band spread spectrum signals, wherein generated pseudo-noise sequence is such that the spread energy of the broad band spread spectrum signals is substantially within the bandwidth of a respective test antenna;
   at least two test antennas for receiving respective broad band spread spectrum signals and transmitting the signals through free space;
   a reflector for receiving and reflecting the transmitted broad band spread spectrum signals; and
   demodulation means for receiving the reflected broad band spread spectrum signals, said demodulation means comprising:
      a receiver for receiving the spread spectrum signals,
      means for generating the same pseudonoise sequence at a predetermined delayed time, and
      a mixer for mixing the broad band spread spectrum signal with the generated pseudo-noise sequence for despreading the broad band spread spectrum signals to obtain the desired signal information relating to the passive intermodulation produced from the test antennas.

10. A method according to claim 9, and further comprising means for decorrelating any signals generated by any reflections or passive intermodulation that is not synchronized with the original spread spectrum signals.

11. A system according to claim 9, wherein said pulse phase modulation means further comprises a shift keyed modulator.

12. A system according to claim 9, and wherein said pulse phase modulation means generates a random pseudo-noise sequence that is orthogonal.

13. A system according to claim 9, wherein said pulse phase modulation means comprises a mixer.

14. A system according to claim 5, wherein said mixer comprises a doubly balanced mixer.

15. A system according to claim 9, wherein said means for generating the same pseudo-noise sequence at a predetermined delayed time comprises an oscillator synchronized with said transmitted spread spectrum signals and a pseudo-noise generator.

16. A method of testing for passive intermodulation in antennas comprising the steps of:
   generating at least two distinct frequencies;
   pulse phase modulating each frequency by mixing each generated frequency with a random pseudonoise sequence to produce respective broad band spread spectrum signals;
   transmitting each spread spectrum signal a through respective test antenna; and demodulating the received spread spectrum signals by generating the same pseudo-noise sequence at a predetermined delayed time and mixing the broad band spread spectrum signal with the generated pseudo-noise sequence for despreading the broad band spread spectrum signals to obtain the desired signal information relating to the passive intermodulation produced from the test antennas.

17. A method of testing according to claim 16, and further comprising the step of reflecting the transmitted spread spectrum signals from a reflector into a receive antenna.

18. A method according to claim 16, and further comprising the step of decorrelating any signals generated by any reflections or passive intermodulation that is not synchronized with the original spread spectrum signals.

19. A method of testing according to claim 16, wherein the step of pulse phase modulating each frequency comprises the steps of modulating each frequency by a shift keyed modulator.

20. A method of testing according to claim 16, and further comprising the step of generating a random pseudo-noise sequence that is orthogonal.

21. A method of testing according to claim 16, wherein said mixing comprises mixing within a doubly balanced mixer.

22. A method of testing according to claim 16, and further comprising the step of generating the random pseudo-noise sequence such that the spread energy is substantially within the bandwidth of the respective test antenna.

23. A method of testing for passive intermodulation in antennas comprising the steps of:

generating at least two distinct frequencies;

modulating each frequency by mixing each generated frequency with a random pseudo-noise sequence to produce respective broad band spread spectrum signals, wherein said generated pseudo-noise sequence is such that the spread energy of the broad band spread spectrum signals is substantially within the bandwidth of a respective test antenna;

transmitting each spread spectrum signal a through respective test antenna;

reflecting the transmitted spread spectrum signals; and demodulating the received spread spectrum signals by generating the same pseudo-noise sequence at a predetermined delayed time and mixing the broad band spread spectrum signal with the generated pseudo-noise sequence for despreading the broad band spread spectrum signals to obtain the desired signal information relating to the passive intermodulation produced from the test antennas.

24. A method according to claim 23, and further comprising the step of decorrelating any signals generated by any reflections or passive that is not synchronized with the original spread spectrum signals.

25. A method of testing according to claim 23, wherein said step of modulating each frequency comprises the steps of pulse phase modulating each frequency.

26. A method of testing according to claim 25, wherein said step of pulse phase modulating each frequency comprises the steps of modulating each frequency by a shift keyed modulator.

27. A method of testing according to claim 25, wherein said step of pulse phase modulating further comprises the steps of generating a random pseudo-noise sequence and mixing the generated sequence with the generated frequency.

28. A method of testing according to claim 23, and further comprising the step of generating a random pseudo-noise sequence that is orthogonal.

29. A method of testing according to claim 23, wherein mixing comprises mixing within a doubly balanced mixer.

30. A method of testing for passive intermodulation in antennas comprising the steps of:

generating at least two distinct frequencies;

modulating each frequency to produce respective broad band spread spectrum signals;

transmitting each broad band spread spectrum signal through a respective test antenna; and demodulating the broad band spectrum signals by despreading the broad band spread spectrum signals to obtain the desired signal information relating to the passive intermodulation produced from the test antennas.

31. A method according to claim 30, and further comprising the step of reflecting the transmitted spread spectrum signals before demodulating the signals.

32. A method according to claim 30, and further comprising the step of decorrelating any signals generated by any reflections or passive intermodulation that is not synchronized with the original spread spectrum signals.

33. A method of testing according to claim 30, wherein said step of modulating each frequency comprises the steps of pulse phase modulating each frequency.

34. A method of testing according to claim 33, wherein said step of pulse phase modulating each frequency comprises the steps of modulating each frequency by a shift keyed modulator.

35. A method of testing according to claim 33, wherein said step of pulse phase modulating further comprises the steps of generating a random pseudo-noise sequence and mixing the generated sequence with a respective generated frequency.

36. A method of testing according to claim 32, and further comprising the step of generating a random pseudo-noise sequence that is orthogonal.

37. A method of testing according to claim 32, wherein said step demodulating further comprises the step of mixing the spread spectrum signals and pseudo-noise sequence.

38. A method of testing according to claim 32, and further comprising the step of generating the random pseudo-noise sequence such that the spread energy is substantially within the bandwidth of the respective test antenna.

39. A method of testing according to claim 30, wherein the step of demodulating the broad band spread spectrum signal comprises the steps of generating the same pseudo-noise sequence at a predetermined delayed time and mixing the broad band spread spectrum signal with the generated pseudo-noise sequence for collapsing the spread spectrum signal to obtain the desired signal information.

40. A method of testing according to claim 30, wherein said step of modulating each frequency comprises the steps of modulating each frequency with a different frequency at predetermined time intervals.

* * * * *